(12) United States Patent
Kim (10) Patent No.: US 9,691,691 B2
(45) Date of Patent: Jun. 27, 2017

(54) SEMICONDUCTOR PACKAGE WITH SIDEWALL CONTACTING BONDING TAPE

(71) Applicant: Samsung Electronics Co., Ltd., Suwon-si, Gyeonggi-do (KR)

(72) Inventor: Yong-Hoon Kim, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/562,656

(22) Filed: Dec. 5, 2014

(65) Prior Publication Data

US 2015/0255381 A1    Sep. 10, 2015

(30) Foreign Application Priority Data

Mar. 6, 2014  (KR) ................ 10-2014-0026595

(51) Int. Cl.
*H01L 23/495*  (2006.01)
*H01L 23/50*  (2006.01)
(Continued)

(52) U.S. Cl.
CPC .. *H01L 23/49575* (2013.01); *H01L 23/49524* (2013.01); *H01L 23/49589* (2013.01); *H01L 23/50* (2013.01); *H01L 24/24* (2013.01); *H01L 24/73* (2013.01); *H01L 25/0655* (2013.01); *H01L 25/0657* (2013.01); *H01L 2224/04042* (2013.01); *H01L 2224/05554* (2013.01); *H01L 2224/06145* (2013.01); *H01L 2224/24145* (2013.01); *H01L 2224/24226* (2013.01);
(Continued)

(58) Field of Classification Search
CPC .......... H01L 23/49575; H01L 25/0657; H01L 24/24; H01L 23/50; H01L 25/0655; H01L 23/49524; H01L 24/73; H01L 24/00; H01L 23/49589; H01L 2224/49175; H01L 2224/05554; H01L 2924/15311; H01L 2224/48247; H01L 2224/32145
USPC ........................................................ 257/666
See application file for complete search history.

(56) References Cited

U.S. PATENT DOCUMENTS 6,320,757 B1 * 11/2001 Liu ................ H01L 23/50
                                                257/691
6,476,506 B1 * 11/2002 O'Connor ........ H01L 23/49838
                                                257/576
6,621,155 B1 *  9/2003 Perino ............. H01L 23/3128
                                                174/538
2002/0011352 A1 * 1/2002 Yoshisato ........ H01L 23/66
                                                174/260

(Continued)

FOREIGN PATENT DOCUMENTS

KR    20120088013 A    8/2012

*Primary Examiner* — Phat X Cao
*Assistant Examiner* — Mohammad M Hoque
(74) *Attorney, Agent, or Firm* — Renaissance IP Law Group LLP (57) ABSTRACT

A semiconductor package having a structure in which a decoupling capacitor is disposed to be adjacent with a semiconductor chip using a vertical chip interconnection (VCI) to improve power integrity. The semiconductor package includes a semiconductor substrate including a first finger pad and a second finger pad, a semiconductor chip mounted on the semiconductor substrate and including a first chip pad and a second chip pad, a bonding tape electrically connecting the first finger pad and the first chip pad, and a bonding wire electrically connecting the second finger pad and the second chip pad. Here, the bonding tape is formed to make contact with a sidewall of the semiconductor chip in a vertical direction of the semiconductor chip.

14 Claims, 10 Drawing Sheets

(51) Int. Cl.
*H01L 23/00* (2006.01)
*H01L 25/065* (2006.01)

(52) U.S. Cl.
CPC ............ *H01L 2224/24246* (2013.01); *H01L 2224/24265* (2013.01); *H01L 2224/32145* (2013.01); *H01L 2224/48091* (2013.01); *H01L 2224/48227* (2013.01); *H01L 2224/48247* (2013.01); *H01L 2224/49175* (2013.01); *H01L 2224/73227* (2013.01); *H01L 2224/73265* (2013.01); *H01L 2224/73267* (2013.01); *H01L 2224/92244* (2013.01); *H01L 2224/92247* (2013.01); *H01L 2225/0651* (2013.01); *H01L 2225/06524* (2013.01); *H01L 2225/06562* (2013.01); *H01L 2225/06565* (2013.01); *H01L 2924/15311* (2013.01); *H01L 2924/19041* (2013.01); *H01L 2924/19105* (2013.01)

(56) References Cited

U.S. PATENT DOCUMENTS

| | | | | |
|---|---|---|---|---|
| 2006/0097365 | A1* | 5/2006 | Song | H01L 23/3128 257/666 |
| 2008/0006923 | A1* | 1/2008 | Otremba | H01L 23/49551 257/686 |
| 2008/0303131 | A1* | 12/2008 | McElrea | H01L 24/24 257/686 |
| 2010/0029043 | A1* | 2/2010 | Lee | H01L 23/49503 438/107 |
| 2011/0227217 | A1* | 9/2011 | Suh | H01L 21/561 257/737 |
| 2013/0161788 | A1* | 6/2013 | Chun | H01L 24/05 257/532 |

* cited by examiner

SEMICONDUCTOR PACKAGE WITH SIDEWALL CONTACTING BONDING TAPE

CROSS-REFERENCE TO RELATED APPLICATION

This application claims priority from Korean Patent Application No. 10-2014-0026595 filed on Mar. 6, 2014 in the Korean Intellectual Property Office, and all the benefits accruing therefrom under 35 U.S.C. 119, the contents of which in its entirety are herein incorporated by reference.

BACKGROUND

This disclosure relates to semiconductor packages.

With recent trends toward highly integrated, high speed semiconductor devices, signal/power integrity associated with interconnection and packaging inside and outside a semiconductor chip is becoming an important issue in terms of performance of the overall system. In particular, recently developed semiconductor devices have a gradually increasing number of signals transmitted at the same time and a continuously increasing signal transmitting speed, resulting in noise due to parasitic inductance, which is referred to as power/ground noise.

As the operating speed of a semiconductor device is increased and the number of signals transmitted at the same time is increased, the power/ground noise may be increased, which may severely adversely affect the high-speed operation of the semiconductor device. In order to overcome the power/ground noise, a decoupling capacitor may be additionally provided on a surface of a substrate, thereby stabilizing power/ground voltage supply.

SUMMARY

An embodiment includes a semiconductor package having a structure in which a decoupling capacitor is disposed to be adjacent with a semiconductor chip using a vertical chip interconnection (VCI) to improve power integrity.

According to an embodiment, a semiconductor package includes a semiconductor substrate including a first finger pad and a second finger pad, a semiconductor chip mounted on the semiconductor substrate and including a first chip pad and a second chip pad, a bonding tape electrically connecting the first finger pad and the first chip pad, and a bonding wire electrically connecting the second finger pad and the second chip pad, wherein the bonding tape is formed to make contact with a sidewall of the semiconductor chip in a vertical direction of the semiconductor chip.

According to another embodiment, a semiconductor package includes a semiconductor substrate including first and second finger pads; a plurality of semiconductor chips stacked on the semiconductor substrate, each semiconductor chip including a first chip pad and a second chip pad; a bonding tape electrically connecting the first finger pad and the first chip pads of the semiconductor chips; and a bonding wire electrically connecting the second finger pad and at least the second chip pad of a top semiconductor chip of the semiconductor chips. The bonding tapes are formed to make contact with sidewalls of the semiconductor chips in vertical directions of the semiconductor chips.

According to another embodiment, a semiconductor package includes a semiconductor substrate including a first finger pad and a second finger pad; a semiconductor chip mounted on the semiconductor substrate and including a first chip pad and a second chip pad; a bonding tape electrically connecting the first finger pad and the first chip pad; and a bonding wire electrically connecting the second finger pad and the second chip pad. The first finger pad is closer to a sidewall of the semiconductor chip than the second finger pad.

BRIEF DESCRIPTION OF THE DRAWINGS

The above and other features and advantages of various embodiment will become more apparent by describing in detail preferred embodiments thereof with reference to the attached drawings in which.

DETAILED DESCRIPTION OF THE EMBODIMENTS

Embodiments will now be described more fully hereinafter with reference to the accompanying drawings, in which preferred embodiments are shown. Embodiments may, however, take different forms and should not be construed as limited to the particular embodiments set forth herein. Rather, these embodiments are provided so that this disclosure will be thorough and complete, and will filly convey the scope to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Embodiments will be described with reference to perspective views, cross-sectional views, and/or plan views, in which particular embodiments are shown. Thus, the profile of an exemplary view may be modified according to manufacturing techniques and/or allowances. That is, the particular embodiments are not intended to limit the scope of other embodiments, unless specifically set forth, but cover all changes and modifications that can be caused due to a change in manufacturing process. Thus, regions shown in the drawings are illustrated in schematic form and the shapes of the regions are presented simply by way of illustration and not as a limitation.

In the following description, a semiconductor package according to an embodiment includes a semiconductor package having a structure capable of improving power integrity (PI). As the semiconductor density increases, multi-stack memories may be used in products. In semiconductor packages with this structure, signal transmission speed and power may be increased and hence, PI improvement may be an important issue. Accordingly, a decoupling capacitor may be mounted on a semiconductor substrate of the semiconductor package. According to an embodiment, the decoupling capacitor may be disposed to be adjacent to a semiconductor device using a vertical chip interconnection (VCI) structure.

Figure 1:
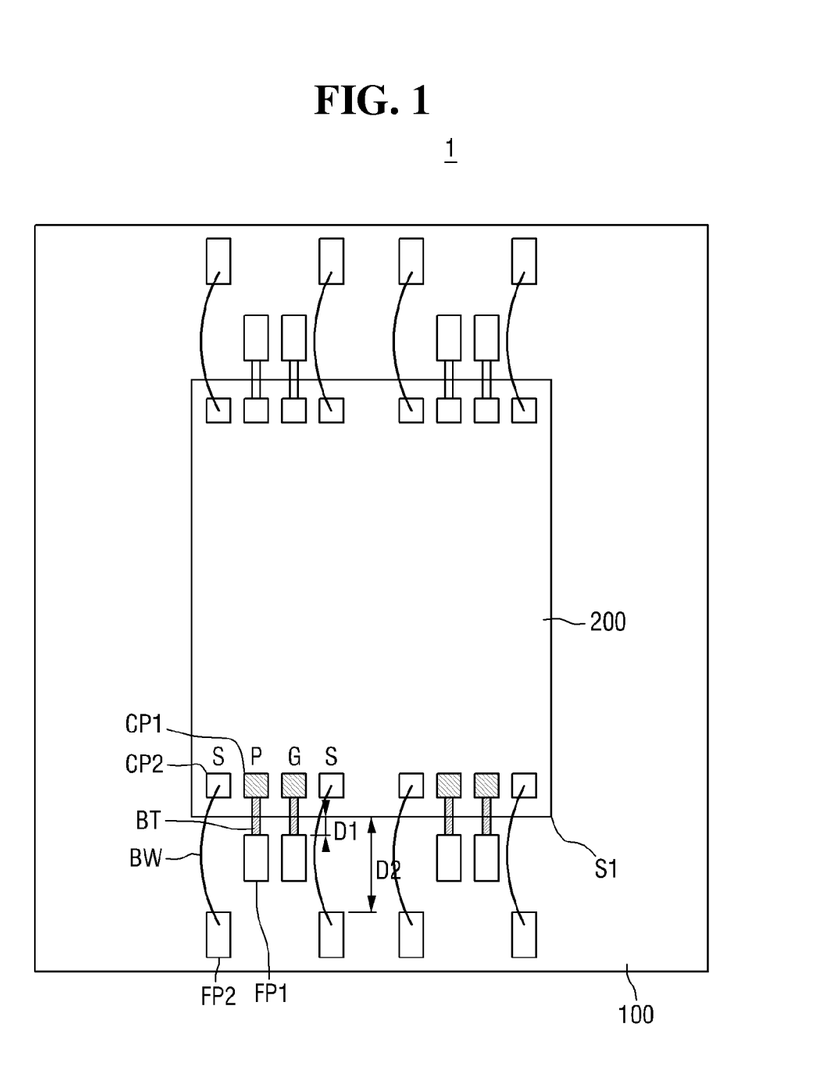
FIG. 1 is a layout view of a semiconductor package according to an embodiment.
Figure 2:
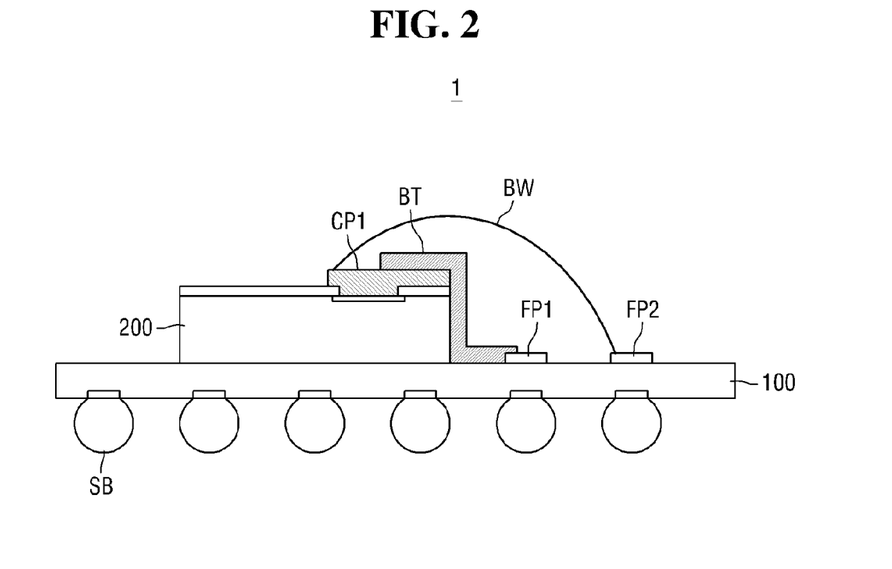
FIG. 2 is a cross-sectional view of a semiconductor package according to an embodiment.

FIG. 1 is a layout view of a semiconductor package according to an embodiment, and FIG. 2 is a cross-sectional view of a semiconductor package according to an embodiment. Referring to FIGS. 1 and 2, in an embodiment, the semiconductor package 1 includes a semiconductor substrate 100, a semiconductor chip 200, a bonding tape BT, and a bonding wire BW.

The semiconductor substrate 100 includes first finger pads FP1 and second finger pads FP2. Each of the first finger pads FP1 and the second finger pads FP2 are pads electrically connected to the semiconductor chip 200 mounted on the semiconductor substrate 100 and may include a conductive material. For example, the first finger pads FP1 and the second finger pads FP2 may include gold (Au), silver (Ag), copper (Cu), nickel (Ni), aluminum (Al), or the like.

The first finger pads FP1 and the second finger pads FP2 may be formed on a top surface of the semiconductor substrate 100. The semiconductor chip 200 may be mounted on the top surface of the semiconductor substrate 100, and the semiconductor substrate 100 and the semiconductor chip 200 may be electrically connected through the first finger pads FP1 and the second finger pads FP2.

The first finger pads FP1 may be connected to power/ground terminals and the second finger pads FP2 may be connected to signal terminals. In addition, multiple first finger pads FP1 and multiple second finger pads FP2 may be disposed on the semiconductor substrate 100. Although eight first finger pads FP1 and eight second finger pads FP2 are illustrated in FIG. 1, other embodiments may include different numbers of first finger pads FP1 and second finger pads FP2. Moreover, the number of first finger pads FP1 and second finger pads FP2 may, but need not be different.

An external terminal may be disposed on a bottom surface of the semiconductor substrate 100. In particular, when a semiconductor package including the semiconductor substrate 100 is electrically connected to another semiconductor package or another semiconductor device, the external terminal may be used. In FIG. 2, a solder ball (SB) is used as an example of the external terminal, but other embodiments are not limited to solder balls SB. For example, the external terminal may be a solder bump, a grid array, a conductive tab, or the like.

The semiconductor substrate 100 may be a packaging substrate such as a printed circuit board (PCB), a lead frame (LF), a ceramic substrate, a silicon wafer, a wiring substrate, or the like. In a particular example, a printed circuit board (PCB) may include a rigid PCB, a flexible PCB, or a rigid flexible PCB.

The semiconductor chip 200 is mounted on the semiconductor substrate 100. The semiconductor chip 200 includes first chip pads CP1 and second chip pads CP2. The first chip pads CP1 may be connected to the power/ground terminals and the second chip pads CP2 may be connected to signal terminals. In particular, the first chip pads CP1 may be electrically connected to the first finger pads FP1 and the second chip pads CP2 may be electrically connected to the second finger pads FP2, thereby electrically connecting the semiconductor substrate 100 and the semiconductor chip 200. As shown in FIG. 1, the first chip pads CP1 and the second chip pads CP2 may be formed on the semiconductor chip 200, and the first chip pads CP1 may be disposed between a pair of second chip pads CP2. That is, the first chip pads CP1 electrically connected to the power terminal may be disposed next to the second chip pads CP2 electrically connected to the signal terminal. The first chip pads CP1 electrically connected to the ground terminal may be disposed next to the first chip pads CP1 electrically connected to the power terminal, and the second chip pads CP2 electrically connected to another the signal terminal disposed next to the first chip pads CP1 electrically connected to the ground terminal. Although a particular arrangement of first chip pads CP1 and second chip pads CP2 has been used as an example, the first chip pads CP1 and second chip pads CP2 may be disposed in other arrangements.

In an embodiment, the semiconductor chip 200 may include a dynamic random access memory (DRAM) chip), a flash memory chip, a resistance changeable memory chip, or another type of memory chip.

In addition, the semiconductor chip 200 may be molded by a molding member (not illustrated) to be protected from external shocks, temperature or moisture The bonding tape BT electrically connects the first finger pads FP1 and the first chip pads CP1. The bonding tape BT may be formed to make contact with the one sidewall of the semiconductor chip 200 in a vertical direction of the semiconductor chip 200. That is, the bonding tape BT may be formed to make contact with the semiconductor substrate 100 and the semiconductor chip 200 while extending from the first finger pads FP1 to the first chip pads CP1. In an embodiment, the bonding tape BT may be conformally formed from a top surface of the semiconductor substrate 100 to a top surface of the corresponding chip pad CP1. With this configuration, as will be described in further detail below, a decoupling capacitor 300 may be disposed to be adjacent to the semiconductor chip 200. That is, the first finger pads FP1 may be formed having a size, shape, or the like on which a decoupling capacitor 300 may be mounted. The decoupling capacitor is not illustrated in FIGS. 1 and 2 so that the first finger pads FP1 may be more clearly identified. PI characteristics can be effectively improved by the position of the first finger pads FP1 allowing a decoupling capacitor 300 to be near to the semiconductor chip 200.

In detail, referring to FIG. 2, the semiconductor chip 200 is mounted on the semiconductor substrate 100, and the first finger pad FP1 formed on the semiconductor substrate 100 and the first chip pad CP1 formed on the semiconductor chip 200 are electrically connected by the bonding tape BT. Here, the bonding tape BT may be made of a conductive material, and examples thereof may include gold (Au), silver (Ag), copper (Cu), nickel (Ni), aluminum (Al), or the like. The bonding tape BT may be formed to contact the first finger pad FP1, to contact the semiconductor substrate 100 from the first finger pad FP1 along the semiconductor substrate 100 to a contact point of the semiconductor substrate 100 and the semiconductor chip 200, to extend along a sidewall of the semiconductor chip 200 from the contact point of the semiconductor substrate 100 and the semiconductor chip 200 in a vertical direction of the semiconductor chip 200 towards a top surface of the semiconductor chip 200 and to make contact with the first chip pad CP1 formed on the semiconductor chip 200.

According to an embodiment, when the decoupling capacitor 300 is formed to be incorporated into the semiconductor package, it can be disposed to be adjacent to the semiconductor chip 200 using VCI technology. According to an embodiment, inductance between the decoupling capacitor 300 and the semiconductor chip 200 can be reduced by 80% or greater by forming the decoupling capacitor 300 to be near to the semiconductor chip 200, compared to a structure in which the decoupling capacitor 300 is connected to the semiconductor chip 200 through a trace and a wire bond, thereby improving the PI characteristics.

The bonding wire BW electrically connects the second finger pad FP2 and the second chip pad CP2. The bonding wire BW is elevated to a predetermined height from the second chip pad CP2 formed on the semiconductor chip 200 and is then lowered to be bonded to the second finger pad FP2 formed on the semiconductor substrate 100. That is to say, the bonding wire BW may be convexly curved in view of the top surface of the semiconductor substrate 100.

According to an embodiment, a first distance D1 horizontally ranging from one surface S1 of the semiconductor chip 200 to the first finger pad FP1 is less than a second distance D2 horizontally ranging from the one surface S1 of the semiconductor chip 200 to the second finger pad FP2, which is a VCI structure in which the decoupling capacitor 300 is formed to be near to the semiconductor chip 200.

Hereinafter, semiconductor packages according to other embodiments will be described.

Figure 3:
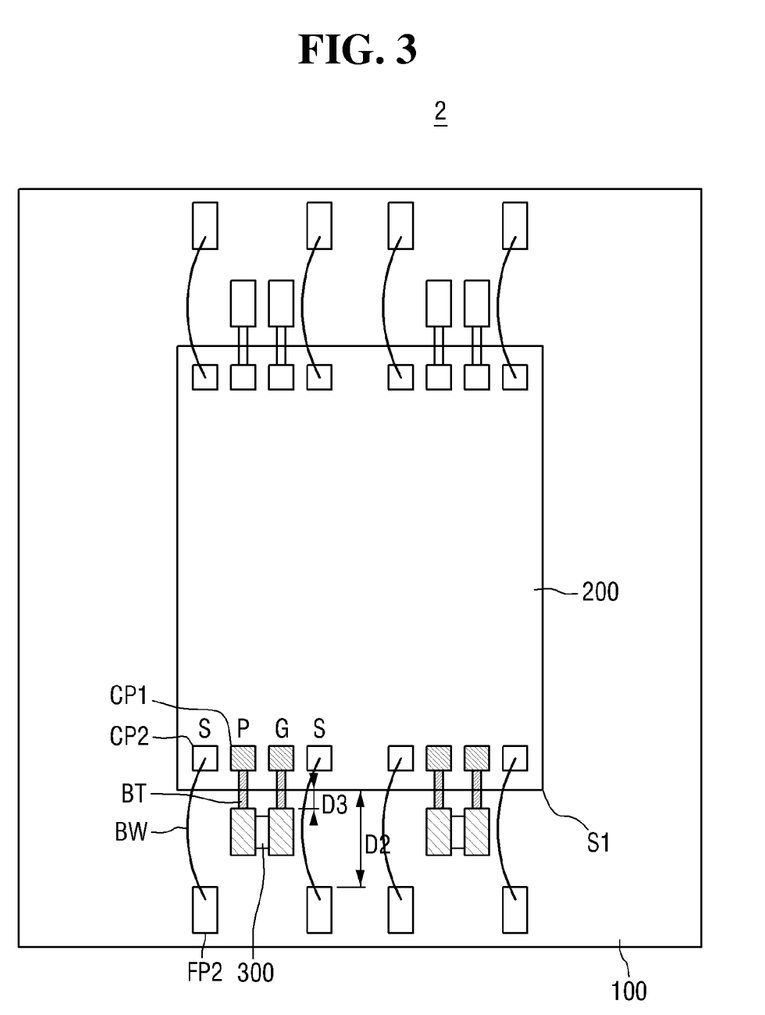
FIG. 3 is a layout view of a semiconductor package according to an embodiment.
Figure 4:
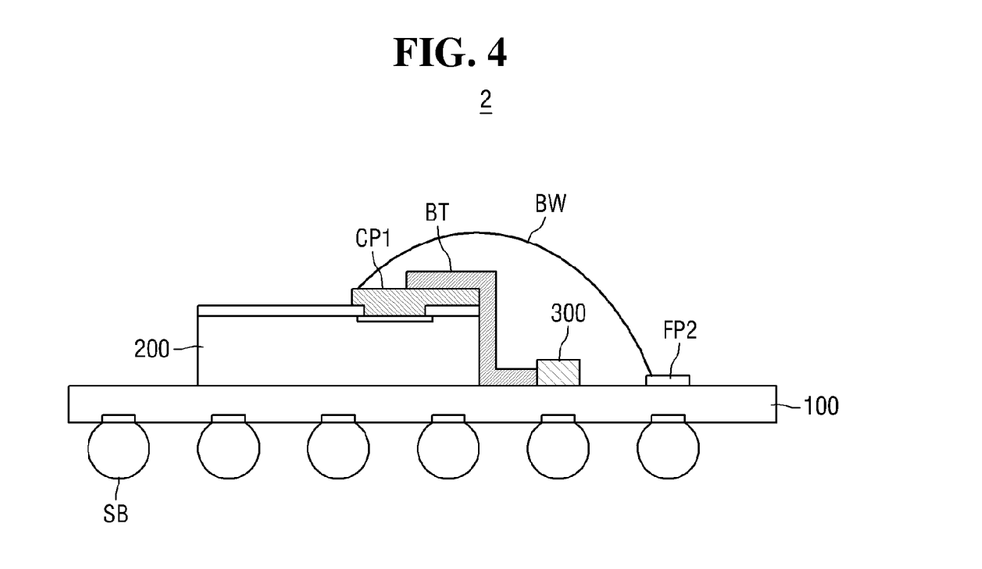
FIG. 4 is a cross-sectional view of the semiconductor package according to an embodiment.

FIG. 3 is a layout view of a semiconductor package according to an embodiment and FIG. 4 is a cross-sectional view of the semiconductor package according to an embodiment. For the sake of convenient explanation, descriptions of substantially the same parts as those of the semiconductor package described above will be omitted.

Referring to FIGS. 3 and 4, the semiconductor package 2 includes a semiconductor substrate 100, a semiconductor chip 200, a bonding tape BT, a bonding wire BW, and a decoupling capacitor 300.

The semiconductor substrate 100 includes first finger pads FP1 and second finger pads FP2. In addition, the semiconductor chip 200 is mounted on the semiconductor substrate 100 and includes first chip pads CP1 and second chip pads CP2. The first finger pads FP1 and the first chip pads CP1 are electrically connected by the bonding tape BT, and the second finger pads FP2 and the second chip pads CP2 are electrically connected by the bonding wire BW.

Here, a first distance D1 horizontally ranging from a surface S1 of the semiconductor chip 200 to the first finger pad FP1 is less than a second distance D2 horizontally ranging from the surface S1 of the semiconductor chip 200 to the second finger pad FP2, which is because the decoupling capacitor 300 is disposed on the first finger pads FP1 so as to be adjacent to the semiconductor chip 200.

The decoupling capacitor 300 is mounted on the semiconductor substrate 100 and is electrically connected to the first finger pad FP1. A third distance D3 horizontally ranging from one surface S1 of the semiconductor chip 200 to the decoupling capacitor 300 is smaller than a second distance D2 horizontally ranging from the one surface S1 of the semiconductor chip 200 to the second finger pad FP2. The decoupling capacitor 300 may be used to stabilize power/ground voltage supply while lowering parasitic inductance. The decoupling capacitor 300 may reduce a chance of the semiconductor chip 200 malfunctioning due to a variation in the power supply voltage or high-frequency noise by supplying current to the semiconductor chip 200 in an event where a load current is sharply changed. In addition, the decoupling capacitor 300 is disposed to be adjacent to a lateral surface of the semiconductor chip 200, thereby lowering inductance generated in a current path of the semiconductor chip 200. In addition, the decoupling capacitor 300 may supply accumulated power to the semiconductor chip 200 when necessary.

The decoupling capacitor 300 includes electrodes formed on both lateral surfaces and a dielectric film disposed between the electrodes. Here, the electrodes of the decoupling capacitor 300 may be conductive bumps or additional conductive films disposed to partially contact the conductive bumps. That is, in an embodiment, the first finger pad FP1 may be used as the electrode unit of the decoupling capacitor 300. Accordingly, the decoupling capacitor 300 may be electrically connected to the semiconductor substrate 100 and the semiconductor chip 200 by the first finger pad FP1.

The decoupling capacitor 300 may be fabricated using a general semiconductor process, so that it can be made in a small size. In addition, since a bottom surface of a substrate of the decoupling capacitor 300 is subjected to grinding, a height of the decoupling capacitor 300 can be reduced.

Therefore, the semiconductor package can be reduced in size by employing the decoupling capacitor 300. In a semiconductor package including a multi-layer ceramic capacitor (MLCC), for example, the MLCC may be directly mounted on a package substrate. However, in the semiconductor package 2, since the decoupling capacitor 300 can achieve high capacitance even with a reduced size, it can be mounted in various manners.

Figure 5:
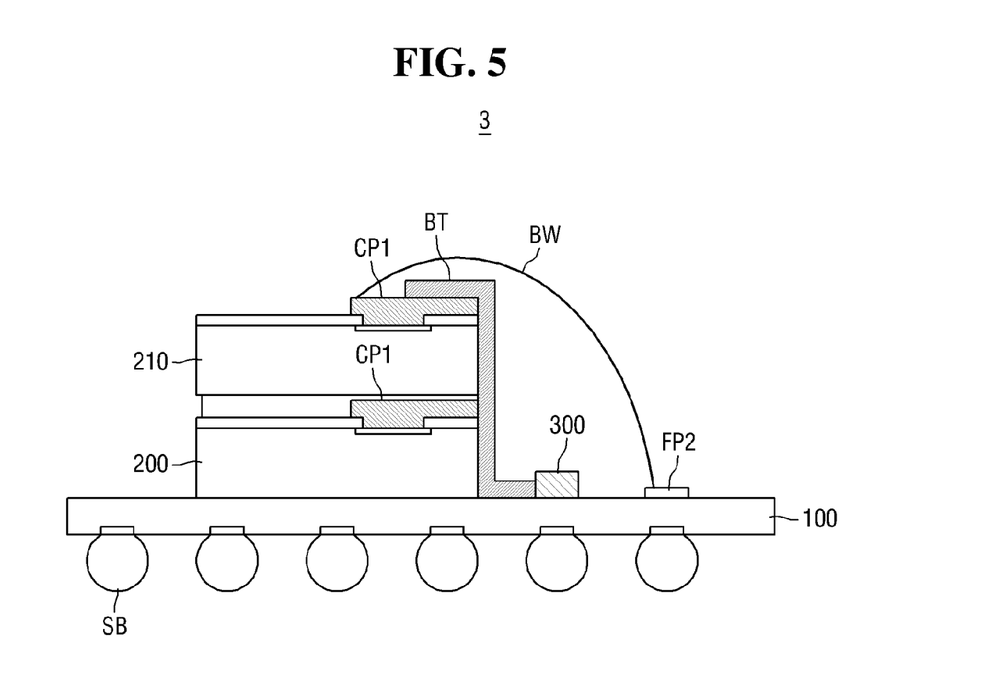
FIG. 5 is a cross-sectional view of a semiconductor package according to an embodiment.

FIG. 5 is a cross-sectional view of a semiconductor package according to an embodiment. For the sake of convenient explanation, descriptions of substantially the same parts as those of the semiconductor packages described above will be omitted.

Referring to FIG. 5, the semiconductor package 3 includes a semiconductor substrate 100, a first semiconductor chip 200, a second semiconductor chip 210, a bonding tape BT, a bonding wire BW, and a decoupling capacitor 300.

The semiconductor package 3 is constructed such that the second semiconductor chip 210 is stacked on the first semiconductor chip 200. According to miniaturization of products and an increase in the density of semiconductor devices, multi-stack semiconductor packages have been recently widely used. As shown in FIG. 5, the semiconductor package 3 includes a stack of the semiconductor chips 200 and 210. In FIG. 5, two semiconductor chips 200 and 210 stacked one on the other are illustrated, but other embodiments are not limited to two semiconductor chips. That is, the semiconductor package 3 may have a structure in which three or more semiconductor chips are stacked one on another. Moreover, although the semiconductor chips 200 and 210 are illustrated as being vertically aligned, the semiconductor chips 200 and 210 may be stacked such that the semiconductor chips 200 and 210 are horizontally offset from each other.

Here, the first semiconductor chip 200 and the second semiconductor chip 210 may be chips of the same type. The first semiconductor chip 200 and the second semiconductor chip 210 are vertically stacked, and first chip pads CP1 of the first semiconductor chip 200 and the second semiconductor chip 210 are electrically connected to electrodes of the decoupling capacitor 300, respectively. Since the first finger pads FP1 on the semiconductor substrate 100 may be the electrodes of the decoupling capacitor 300, all of the semiconductor substrate 100, the first semiconductor chip 200, the second semiconductor chip 210 and the decoupling capacitor 300 may be electrically connected by the first finger pads FP1.

In the semiconductor package 3, the bonding tape BT may be formed to make contact with the electrodes of the decoupling capacitor 300 and then extend from the electrodes of the decoupling capacitor 300 to a contact point of the semiconductor substrate 100 and the first semiconductor chip 200 along the semiconductor substrate 100, to then extend along a sidewall of the first semiconductor chip 200 and a sidewall of the second semiconductor chip 210 from the contact point of the semiconductor substrate 100 in a vertical direction towards a top surface of the second semiconductor chip 210, and to make contact with the first chip pad CP1 formed on the second semiconductor chip 210.

In addition, the first chip pad CP1 of the first semiconductor chip 200 is formed to make contact with a route having the bonding tape BT, thereby electrically connecting the first semiconductor chip 200 to the bonding tape BT.

Figure 6:
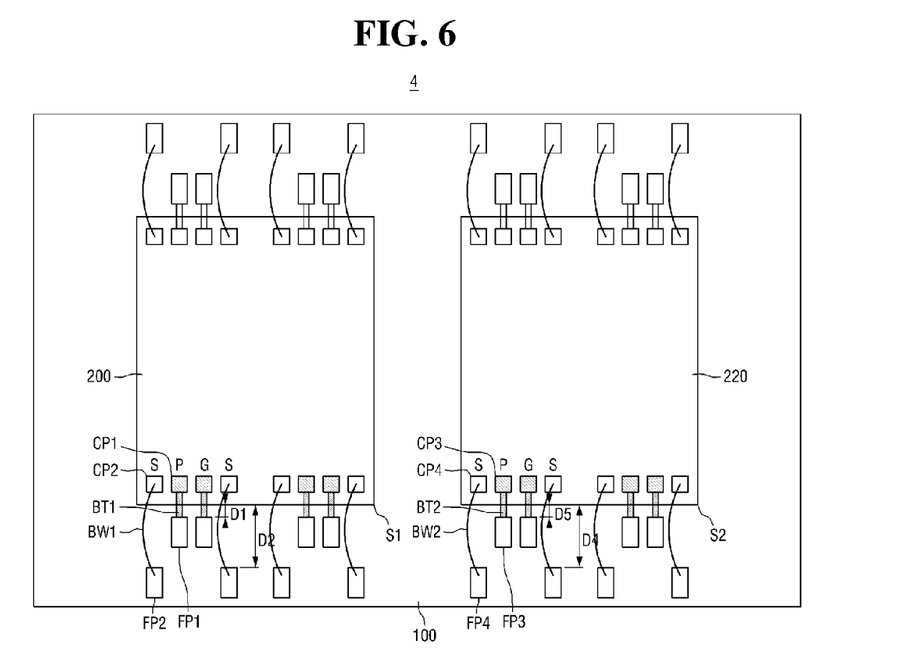
FIG. 6 is a layout view of a semiconductor package according to an embodiment.
Figure 7:
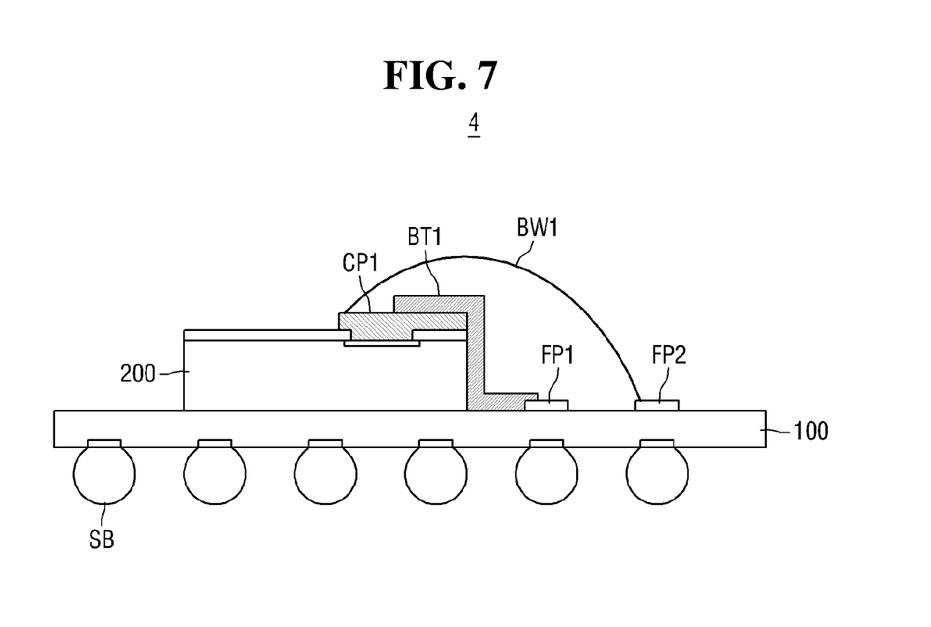
FIG. 7 is a first cross-sectional view of the semiconductor package according to an embodiment.
Figure 8:
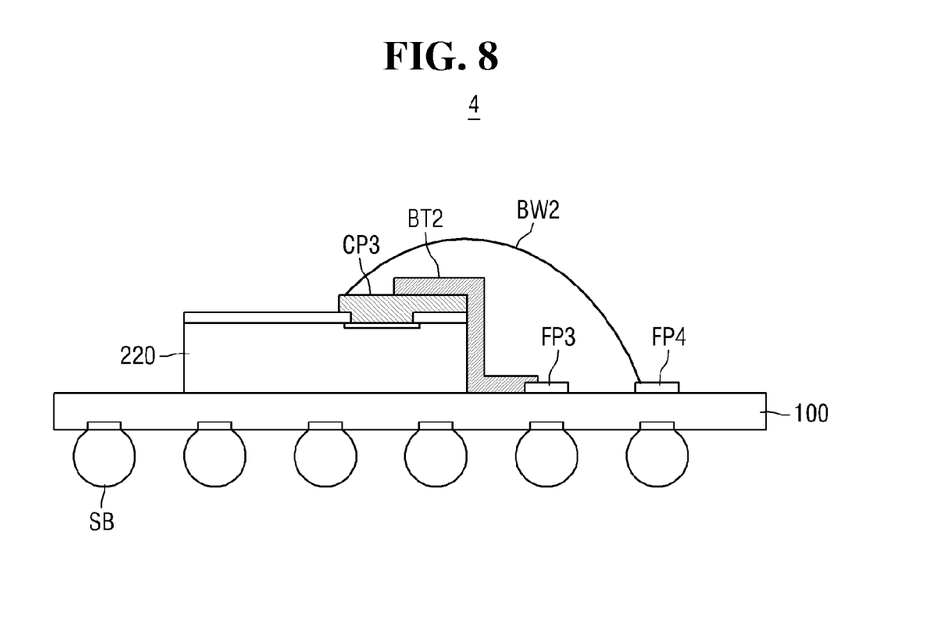
FIG. 8 is a second cross-sectional view of the semiconductor package according to an embodiment.

FIG. 6 is a layout view of a semiconductor package according to an embodiment, FIG. 7 is a first cross-sectional view of the semiconductor package according to an embodiment, and FIG. 8 is a second cross-sectional view of the semiconductor package according to an embodiment. For the sake of convenient explanation, descriptions of substantially the same parts as those of the semiconductor packages described above will be omitted.

Referring to FIGS. 6 to 8, the semiconductor package 4 includes a semiconductor substrate 100, a first semiconductor chip 200, a third semiconductor chip 220, a first bonding tape BT1, a second bonding tape BT2, a first bonding wire BW1, and a second bonding wire BW2.

The semiconductor substrate 100 includes first to fourth finger pads FP1, FP2, FP3 and FP4. The first to fourth finger pads FP1, FP2, FP3 and FP4 may be pads electrically connected to the first semiconductor chip 200 or the third semiconductor chip 220 mounted on the semiconductor substrate 100 and may be made of conductive material. For example, the first to fourth finger pads FP1, FP2, FP3 and FP4 may include gold (Au), silver (Ag), copper (Cu), nickel (Ni), aluminum (Al), or the like.

The first to fourth finger pads FP1, FP2, FP3 and FP4 may be formed on a top surface of the semiconductor substrate 100. The first semiconductor chip 200 and the third semiconductor chip 220 may be mounted on the top surface of the semiconductor substrate 100. The semiconductor substrate 100, the first semiconductor chip 200 and the third semiconductor chip 220 may be electrically connected through the first to fourth finger pads FP1, FP2, FP3 and FP4.

The first finger pads FP1 and the third finger pad FP3 may be connected to power/ground terminals and the second finger pads FP2 and the fourth finger pad FP4 may be connected to signal terminals. In addition, multiple first to fourth finger pads FP1, FP2, FP3 and FP4 may be disposed on the semiconductor substrate 100.

The first semiconductor chip 200 and the third semiconductor chip 220 are mounted on the semiconductor substrate 100. The first semiconductor chip 200 includes first chip pads CP1 and second chip pads CP2, and the third semiconductor chip 220 includes third chip pads CP3 and fourth chip pads CP4. The first chip pads CP1 and the third chip pads CP3 may be connected to the power/ground terminals and the second chip pad CP2 and the fourth chip pad CP4 may be connected to the signal terminals.

That is, the first chip pad CP1 may be electrically connected to the first finger pad FP1, the second chip pad CP2 may be electrically connected to the second finger pad FP2, the third chip pad CP3 may be electrically connected to the third finger pad FP3, and the fourth chip pad CP4 may be electrically connected to the fourth finger pad FP4, thereby electrically connecting the semiconductor substrate 100 and the first and third semiconductor chips 200 and 220.

The first bonding tape BT1 electrically connects the first finger pad FP1 and the first chip pad CP1, and the second bonding tape BT2 electrically connects the third finger pad FP3 and the third chip pad CP3. The first bonding tape BT1 may be formed on a sidewall of the first semiconductor chip 200 so as to make contact with the sidewall of the first semiconductor chip 200 along a vertical direction of the first semiconductor chip 200. The second bonding tape BT2 may be formed on a sidewall of the third semiconductor chip 220 so as to make contact with the sidewall of the third semiconductor chip 220 along a vertical direction of the third semiconductor chip 220. That is to say, the first bonding tape BT1 may be formed to make contact with the semiconductor substrate 100 and the first semiconductor chip 200 while extending from the first finger pad FP1 to the first chip pad CP1. The second bonding tape BT2 may be formed to make contact with the semiconductor substrate 100 and the third semiconductor chip 220 while extending from the third finger pad FP3 to the third chip pad CP3.

In more detail, referring to FIGS. 7 and 8, the first and third semiconductor chips 200 and 220 are mounted on the semiconductor substrate 100. The first finger pad FP1 formed on the semiconductor substrate 100 and the first chip pad CP1 formed on the first semiconductor chip 200 are electrically connected by the first bonding tape BT1, and the third finger pad FP3 and the third chip pad CP3 formed on the third semiconductor chip 220 are electrically connected by the second bonding tape BT2. Here, the first and second bonding tapes BT1 and BT2 may be made of conductive materials. For example, the first and second bonding tapes BT1 and BT2 may include gold (Au), silver (Ag), copper (Cu), nickel (Ni), aluminum (Al), or the like.

The first bonding tape BT1 may be formed to make contact with the first finger pad FP1, to make contact with the semiconductor substrate 100 along the semiconductor substrate 100 from the first finger pad FP1 to a contact point of the semiconductor substrate 100 and the first semiconductor chip 200, to then extend along a sidewall of the first semiconductor chip 200 in a vertical direction of the first semiconductor chip 200 from the contact point of the semiconductor substrate 100 and the first semiconductor chip 200 towards a top surface of the first semiconductor chip 200, and to make contact with the first chip pad CP1 formed on the first semiconductor chip 200.

The second bonding tape BT2 may be formed to make contact with the third finger pad FP3, to make contract with the semiconductor substrate 100 from the third finger pad FP3 along the semiconductor substrate 100 to a contract point of the semiconductor substrate 100 and the third semiconductor chip 220, to then extend along a sidewall of the third semiconductor chip 220 in a vertical direction of the third semiconductor chip 220 towards a top surface of the third semiconductor chip 220, and to make contact with the third chip pad CP3 formed on the third semiconductor chip 220.

The first bonding wire BW1 electrically connects the second finger pads FP2 and the second chip pads CP2, and the second bonding tape BT2 electrically connects the third finger pads FP3 and the third chip pads CP3 and the second bonding wire BW2 electrically connects the fourth finger pads FP4 and the fourth chip pads CP4. The first or second bonding wire BW1, BW2 may be elevated to a predetermined height from the second or fourth chip pad CP2, CP4 formed on the first or third semiconductor chip 200, 220 to then be lowered and may be bonded to the second or fourth finger pad FP2, FP4 formed on the semiconductor substrate 100. That is to say, the first or second bonding wire BW1, BW2 may be convexly curved in view of the top surface of the semiconductor substrate 100.

The first semiconductor chip 200 and the third semiconductor chip 220 are disposed on the semiconductor substrate 100 to be parallel with each other.

According to an embodiment, a first distance D1 horizontally ranging from a first surface S2 of the semiconductor chip 200 to the first finger pad FP1 is less than a second distance D2 horizontally ranging from the first surface S1 of the semiconductor chip 200 to the second finger pad FP2. In addition, a fourth distance D4 horizontally ranging from a first surface S2 of the third semiconductor chip 220 to the fourth finger pad FP4 is greater than a fifth distance D5 horizontally ranging from the first surface S2 of the third semiconductor chip 220 to the third finger pad FP3.

Figure 9:
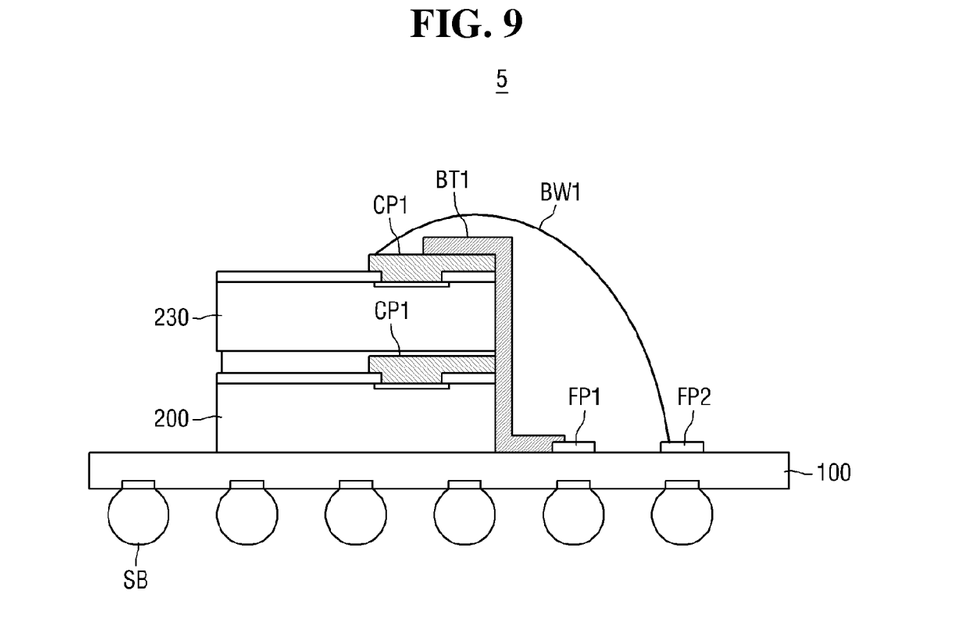
FIG. 9 is a first cross-sectional view of a semiconductor package according to an embodiment.
Figure 10:
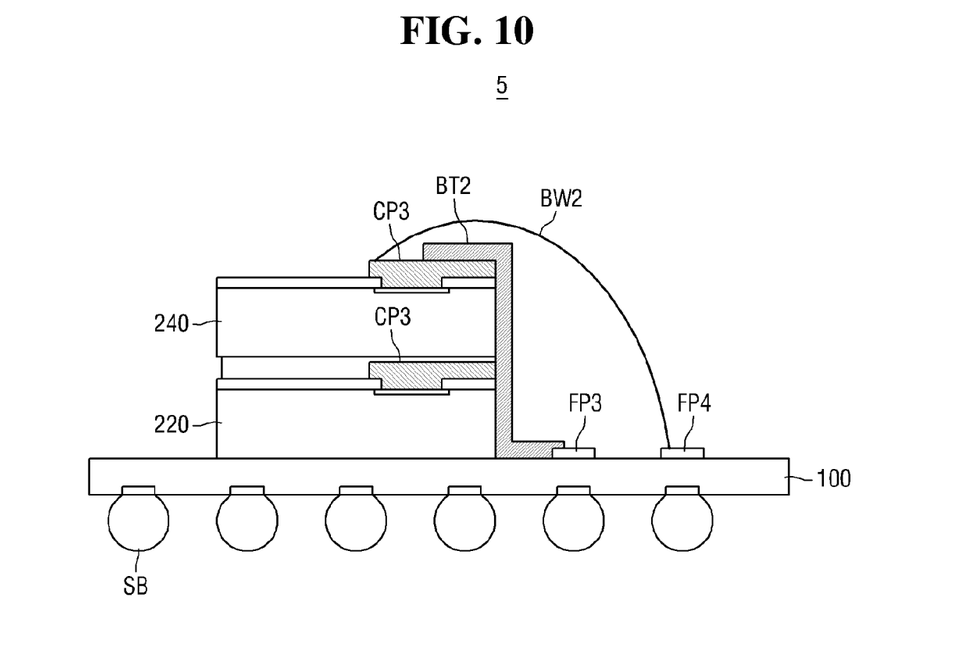
FIG. 10 is a second cross-sectional view of the semiconductor package according to an embodiment.

FIG. 9 is a first cross-sectional view of a semiconductor package according to an embodiment, and FIG. 10 is a second cross-sectional view of the semiconductor package according to an embodiment. For the sake of convenient explanation, descriptions of substantially the same parts as those of the semiconductor packages described above will be omitted.

Referring to FIGS. 9 and 10, the semiconductor package 5 according to an embodiment includes a semiconductor substrate 100, a first semiconductor chip 200, a third semiconductor chip 220, a fourth semiconductor chip 230, a fifth semiconductor chip 240, a first bonding tape BT1, a second bonding tape BT2, a first bonding wire BW1, and a second bonding wire BW2.

The semiconductor package 5 is constructed such that the fourth semiconductor chip 230 is stacked on the first semiconductor chip 200 and the fifth semiconductor chip 240 is stacked on the third semiconductor chip 220.

As shown in FIGS. 9 and 10, the semiconductor package 5 includes stacks of the semiconductor chips 200, 220, 230 and 240. In FIGS. 9 and 10, each two semiconductor chips stacked one on the other are illustrated, the number of semiconductor chips is not limited to two. That is, the semiconductor package 5 may have a structure in which three or more semiconductor chips are stacked one on another.

In the semiconductor package 5, the first bonding tape BT1 may be formed to make contact with the semiconductor substrate 100 from the first finger pad FP1 along the semiconductor substrate 100 to then extend to a contact point of the semiconductor substrate 100 and the first semiconductor chip 200, to then extend along a sidewall of the first semiconductor chip 200 and a sidewall of the fourth semiconductor chip 230 from the contact point of the semiconductor substrate 100 and the first semiconductor chip 200 in a vertical direction along the sidewall of the first semiconductor chip 200 and the sidewall of the fourth semiconductor chip 230, and to make contact with the first chip pad CP1 formed on the fourth semiconductor chip 230.

In addition, the first chip pad CP1 of the first semiconductor chip 200 is formed to make contact with a route having the first bonding tape BT1, thereby electrically connecting the first semiconductor chip 200 to the first bonding tape BT1.

The second bonding tape BT2 may be formed to make contact with the semiconductor substrate 100 from the third finger pad FP3 along the semiconductor substrate 100 to then extend to a contact point of the semiconductor substrate 100 and the third semiconductor chip 220, to make contact with a sidewall of the third semiconductor chip 220 and a sidewall of the fifth semiconductor chip 240 from the contact point of the semiconductor substrate 100 and the third semiconductor chip 220 in a vertical direction along the sidewall of the third semiconductor chip 220 and the sidewall of the fifth semiconductor chip 240, and to make contact with the third chip pad CP3 formed on the fifth semiconductor chip 240.

In addition, the third chip pad CP3 of the third semiconductor chip 220 is formed to make contact with a route having the second bonding tape BT2, thereby electrically connecting the third semiconductor chip 220 to the second bonding tape BT2.

Figure 11:
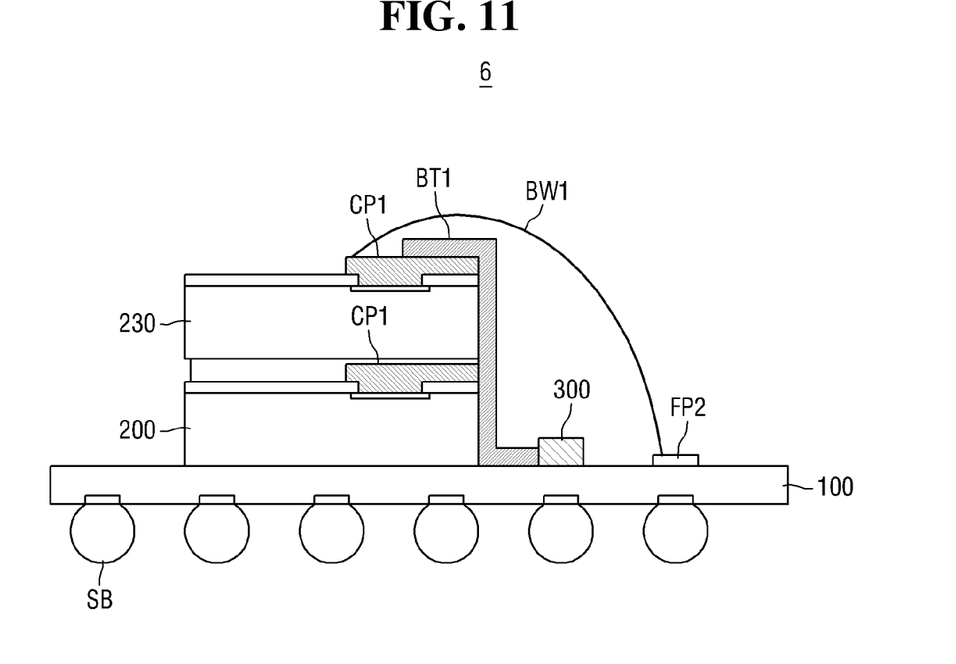
FIG. 11 is a first cross-sectional view of a semiconductor package according to an embodiment.
Figure 12:
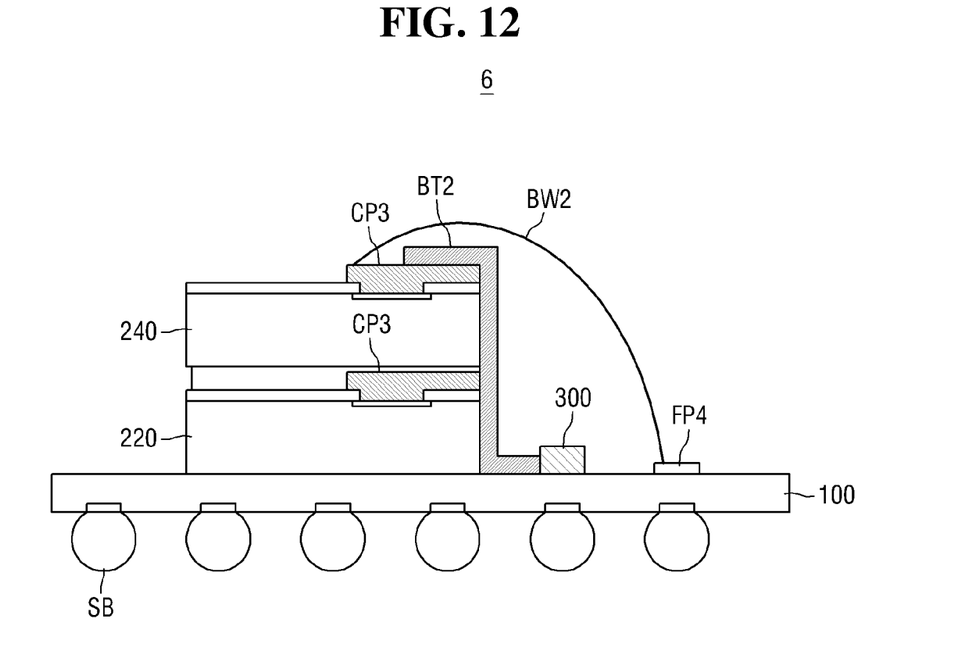
FIG. 12 is a second cross-sectional view of the semiconductor package according to an embodiment.

FIG. 11 is a first cross-sectional view of a semiconductor package according to an embodiment and FIG. 12 is a second cross-sectional view of the semiconductor package according to an embodiment. For the sake of convenient explanation, descriptions of substantially the same parts as those of the semiconductor packages described above will be omitted.

Referring to FIGS. 11 and 12, the semiconductor package 6 according to an embodiment includes a semiconductor substrate 100, a first semiconductor chip 200, a third semiconductor chip 220, a fourth semiconductor chip 230, a fifth semiconductor chip 240, a first bonding tape BT1, a second bonding tape BT2, a first bonding wire BW1, a second bonding wire BW2, a first decoupling capacitor 300, and a second decoupling capacitor 310.

The first and second decoupling capacitors 300 and 310 are mounted on the semiconductor substrate 100 and are electrically connected to the corresponding first finger pad FP1 or third finger pad FP3, which is a VCI structure in which the first or second decoupling capacitor 300 or 310 is formed to be near to the first or third semiconductor chip 200 or 220. With this configuration, the first or second decoupling capacitor 300 or 310 may be disposed to be adjacent to the corresponding first or third semiconductor chip 200 or 220. PI characteristics can be effectively improved by positioning the first or second decoupling capacitor 300, 310 to be near to the corresponding first or third semiconductor chip 200 or 220.

According to another embodiment, a semiconductor package includes a semiconductor substrate including first to fourth finger pads, a first semiconductor chip mounted on the semiconductor substrate and including a first chip pad and a second chip pad, a second semiconductor chip mounted on the semiconductor substrate to be parallel with the first semiconductor chip and including a third chip pad and a fourth chip pad, first and second bonding tapes electrically connecting the first and third finger pads and the first and third chip pads, respectively, and first and second bonding wires electrically connecting the second and fourth finger pads and the second and fourth chip pads, respectively, wherein the first and second bonding tapes are formed to make contact with first sidewalls of the first and second semiconductor chips in vertical directions of the first and second semiconductor chips.

Figure 13:
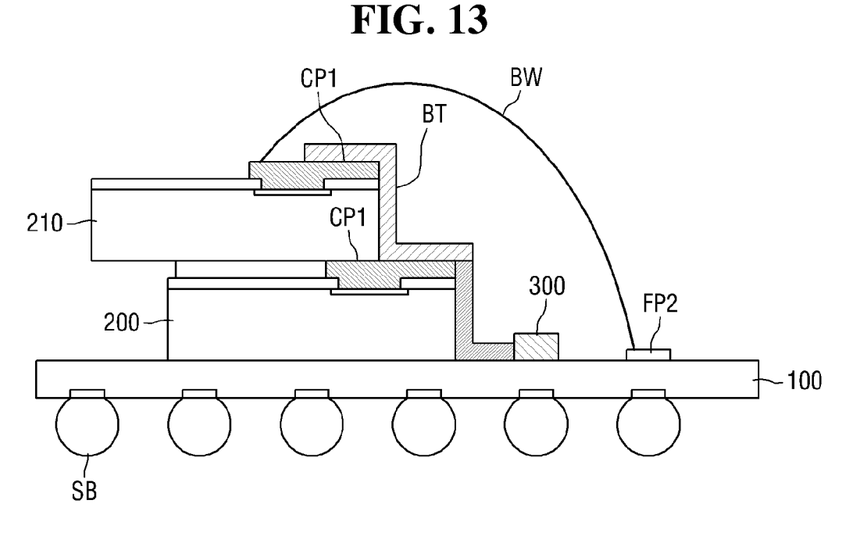
FIG. 13 is a cross-sectional view of a semiconductor package according to an embodiment.

FIG. 13 is a cross-sectional view of a semiconductor package according to an embodiment. For the sake of convenient explanation, descriptions of substantially the same parts as those of the semiconductor packages described above will be omitted. In this embodiment, first and second semiconductor chips 200 and 210 are stacked on the semiconductor substrate 100. However, the second semiconductor chip 210 is horizontally offset from the first semiconductor chip 200. As a result, the first and second semiconductor chips 200 and 210 may have a terraced and/or stepped shape. The first chip pad CP1 of the first semiconductor chip 200 may be exposed by the second semiconductor chip 210. The bonding tape BT may extend from the first finger pad FP1, along the semiconductor substrate 100 to a sidewall of the first semiconductor chip 200, along the sidewall of the first semiconductor chip 200 to the top surface of the first semiconductor chip 200, along the top surface of the first semiconductor chip 200 to a sidewall of the second semiconductor chip 210, along the sidewall of the second semiconductor chip 210 to the top surface of the second semiconductor chip 210, and to the first chip pad CP1 of the second semiconductor chip 210.

Figure 14:
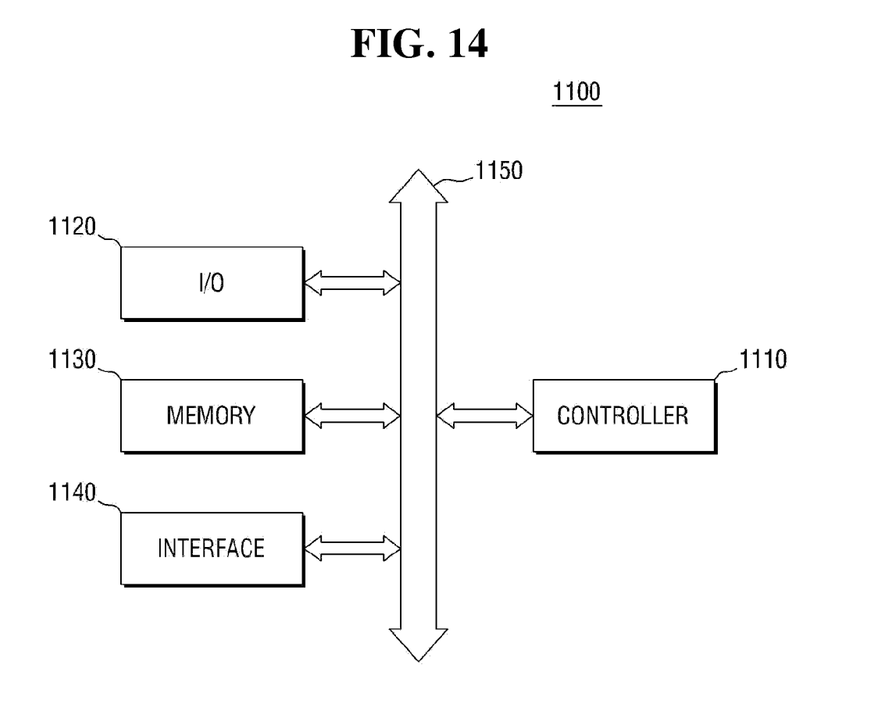
FIG. 14 is a block diagram of an electronic system including semiconductor devices according to some embodiments.

FIG. 14 is a block diagram of an electronic system including semiconductor devices according to some embodiments. Referring to FIG. 14, the electronic system 1100 may include a controller 1110, an input/output device (I/O) 1120, a memory 1130, an interface 1140 and a bus 1150. The controller 1110, the I/O 1120, the memory 1130, and/or the interface 1140 may be connected to each other through the bus 1150. The bus 1150 corresponds to a path through which data moves.

The controller 1110 may include at least one of a microprocessor, a digital signal processor, a microcontroller, logic elements capable of functions similar to those of these elements, or a combination of such elements. The I/O 1120 may include a keypad, a keyboard, a display device, and so on. The memory 1130 may be configured to store data and/or commands. The interface 1140 may be configured to perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as a working memory for improving the operation of the controller 1110. The semiconductor devices according to the embodiments described herein may be included in the memory 1130 or may be provided as some components of the controller 1110, the I/O 1120, and/or the interface 1140.

The electronic system 1100 may be included in a personal digital assistant (PDA), a portable computer, a web tablet, a wireless phone, a mobile phone, a digital music player, a memory card, any type of electronic device capable of transmitting and/or receiving information in a wireless environment, or the like.

Figure 15:
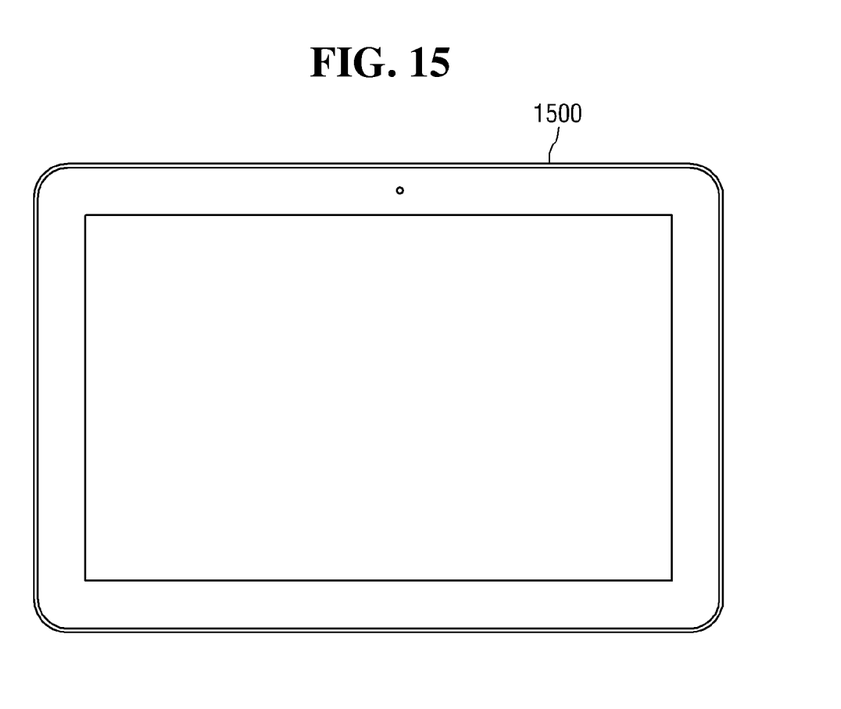
FIGS. 15 and 16 illustrate examples of semiconductor systems to which semiconductor devices according to some embodiments can be applied.
Figure 16:
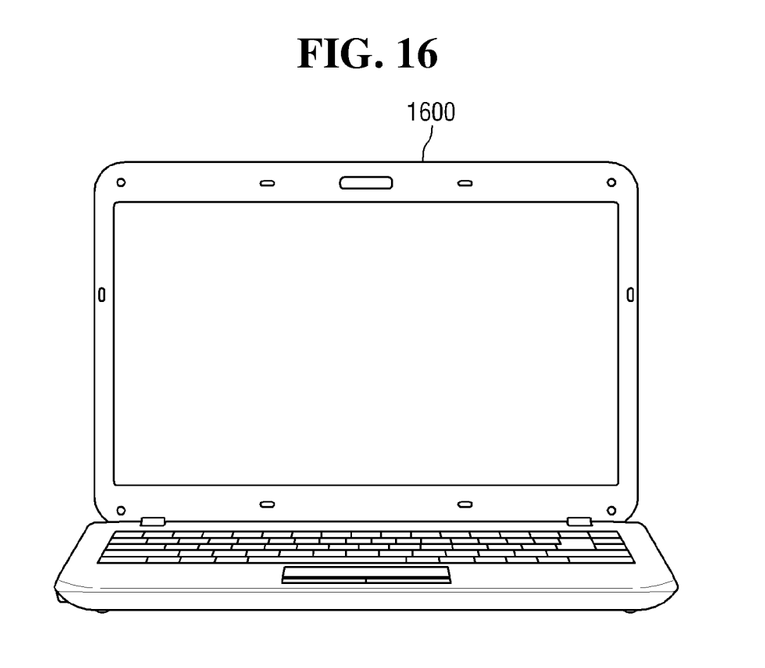

FIGS. 15 and 16 illustrate examples of semiconductor systems including semiconductor devices according to some embodiments. FIG. 15 illustrates an example in which a semiconductor device according to an embodiment is included in a tablet PC 1500, and FIG. 16 illustrates an example in which a semiconductor device according to an embodiment is included in a notebook computer 1600. One or more of the semiconductor devices described herein may be included in a tablet PC 1500, a notebook computer 1600, and the like.

While embodiments have been particularly shown and described with reference to particular embodiments, it will be understood by those of ordinary skill in the art that various changes in form and details may be made therein without departing from the spirit and scope as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor package comprising:
a semiconductor substrate:
a plurality of first finger pads contacting the substrate;
a second finger pad contacting the substrate;
a semiconductor chip mounted on the semiconductor substrate and including a plurality of first chip pads and a second chip pad;
a plurality of bonding tapes, each electrically connecting a corresponding one of the first finger pads and a corresponding one of the first chip pads;
a bonding wire electrically connecting the second finger pad and the second chip pad; and
a decoupling capacitor disposed on a first one and a second one of the first finger pads and electrically connected between the first one and the second one of the first finger pads;

wherein:
each of the bonding tapes is formed to make contact with a sidewall of the semiconductor chip in a vertical direction of the semiconductor chip and make contact with the corresponding one of the first finger pads; and
the first one and the second one of the first finger pads are substantially equidistant from the semiconductor chip.

2. The semiconductor package of claim 1, wherein each of the bonding tapes contacts the semiconductor substrate along a length of the bonding tape extending from the corresponding first finger pad to the semiconductor chip.

3. The semiconductor package of claim 1, wherein each of the bonding tape is conformally formed on the semiconductor substrate and the sidewall of the semiconductor chip from the corresponding first finger pad to the corresponding first chip pad.

4. The semiconductor package of claim 1, wherein a first distance horizontally ranging from the sidewall of the semiconductor chip to the first finger pads is less than a second distance horizontally ranging from the sidewall of the semiconductor chip to the second finger pad.

5. The semiconductor package of claim 1, wherein the decoupling capacitor is closer to the sidewall of the semiconductor package than the second finger pad.

6. The semiconductor package of claim 1, wherein the first finger pad is connected to a power terminal or a ground terminal and the second finger pad is connected to a signal terminal.

7. The semiconductor package of claim 1, wherein:
the second finger pad is part of a plurality of second finger pads contacting the semiconductor substrate; and
the second chip pad is part of a plurality of second chip pads of the semiconductor chip.

8. The semiconductor package of claim 7, wherein the first one and the second one of the first finger pads are disposed between a pair of adjacent second finger pads.

9. A semiconductor package comprising:
a semiconductor substrate:
a plurality of first finger pads contacting the substrate;
a plurality of second finger pads contacting the substrate;
a plurality of semiconductor chips stacked on the semiconductor substrate, each semiconductor chip including a plurality of first chip pads and a second chip pad;
a plurality of bonding tapes, each electrically connecting the first finger pad and a corresponding one of the first chip pads of each of the semiconductor chips;
a bonding wire electrically connecting the second finger pad and at least the second chip pad of a top semiconductor chip of the semiconductor chips; and
a decoupling capacitor mounted on the semiconductor substrate;
wherein each of the bonding tapes is formed to make contact with sidewalls of the semiconductor chips in vertical directions of the semiconductor chips and make contact with a first one and a second one of the first finger pads, and
wherein each of the first one and the second one of the first finger pads is an electrode of the decoupling capacitor.

10. The semiconductor package of claim 9, wherein each of the bonding tapes contacts the semiconductor substrate along a length of the bonding tape extending from the corresponding first finger pad to a bottom semiconductor chip of the semiconductor chips.

11. The semiconductor package of claim 9, wherein a first distance horizontally ranging from a sidewall of a bottom semiconductor chip of the semiconductor chips to the first finger pads is less than a second distance horizontally ranging from the sidewall of the bottom semiconductor chip to the second finger pad.

12. The semiconductor package of claim 9, wherein the semiconductor chips are horizontally offset from each other.

13. The semiconductor package of claim 9, wherein for each of at least one of the semiconductor chips, the first chip pad contacts the bonding tape at a sidewall of the semiconductor chip.

14. A semiconductor package comprising:
a semiconductor substrate:
a plurality of a first finger pads contacting the substrate;
a second finger pad contacting the substrate;
a semiconductor chip mounted on the semiconductor substrate and including a plurality of first chip pads and a second chip pad;
a plurality of bonding tapes, each electrically connecting a corresponding one of the first finger pads and a corresponding one of the first chip pads and formed to make contact with the corresponding one of the first finger pads;
a bonding wire electrically connecting the second finger pad and the second chip pad; and
a decoupling capacitor disposed on a first one and a second one of the first finger pads and electrically connected between the first one and the second one of the first finger pads;
wherein the first finger pads are closer to a sidewall of the semiconductor chip than the second finger pad.

* * * * *